United States Patent
Tsurumi

(10) Patent No.: US 7,385,129 B2
(45) Date of Patent: Jun. 10, 2008

(54) MUSIC REPRODUCING SYSTEM

(75) Inventor: Kanehisa Tsurumi, Inasa-gun (JP)

(73) Assignee: Yamaha Corporation, Hamamatsu-shi (JP)

(*) Notice: Subject to any disclaimer, the term of this patent is extended or adjusted under 35 U.S.C. 154(b) by 347 days.

(21) Appl. No.: 10/953,839

(22) Filed: Sep. 29, 2004

(65) Prior Publication Data
US 2005/0172787 A1 Aug. 11, 2005

(30) Foreign Application Priority Data
Sep. 30, 2003 (JP) .................. P. 2003-341928

(51) Int. Cl.
*G10H 1/00* (2006.01)
(52) U.S. Cl. .......................... 84/600; 84/645
(58) Field of Classification Search .......... 84/600–602, 84/645; 434/307 A
See application file for complete search history.

(56) References Cited

U.S. PATENT DOCUMENTS 6,888,999 B2 * 5/2005 Herberger et al. ............ 386/65

* cited by examiner

*Primary Examiner*—Lincoln Donovan
*Assistant Examiner*—David S. Warren
(74) *Attorney, Agent, or Firm*—Pillsbury Winthrop Shaw Pittman LLP

(57) ABSTRACT

The reproducing of the MP3 part is started from a first reproducing start position that is positioned prior to a second pointed reproducing start position. In this case, this MP3 part is mute-reproduced in a period that extends from the first reproducing start position to a timing corresponding to the second reproducing start position. Then, the mute is canceled when progress of the MP3 part arrives at a timing corresponding to the second reproducing start position, and at the same time the reproducing of the MIDI part is started.

14 Claims, 9 Drawing Sheets

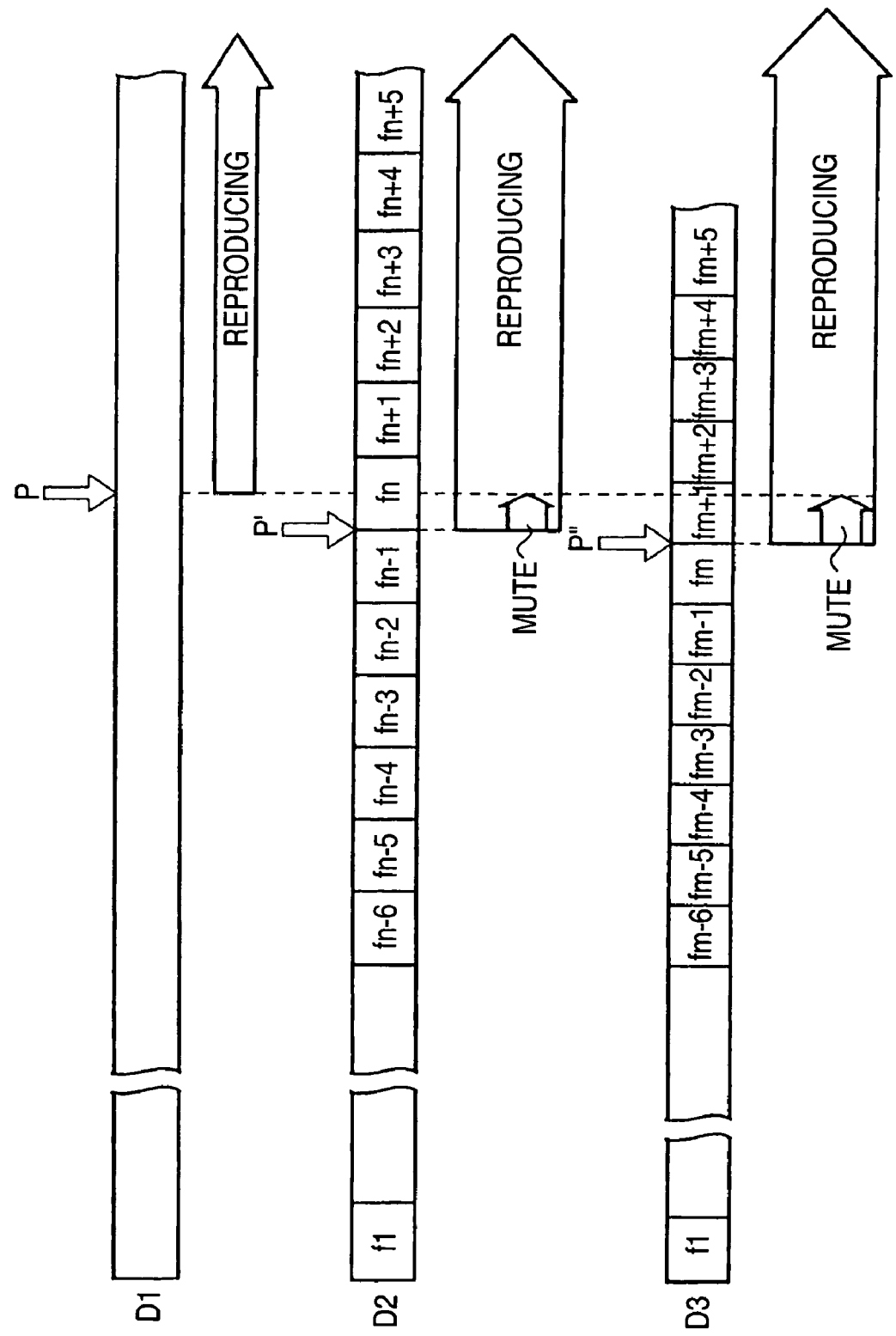

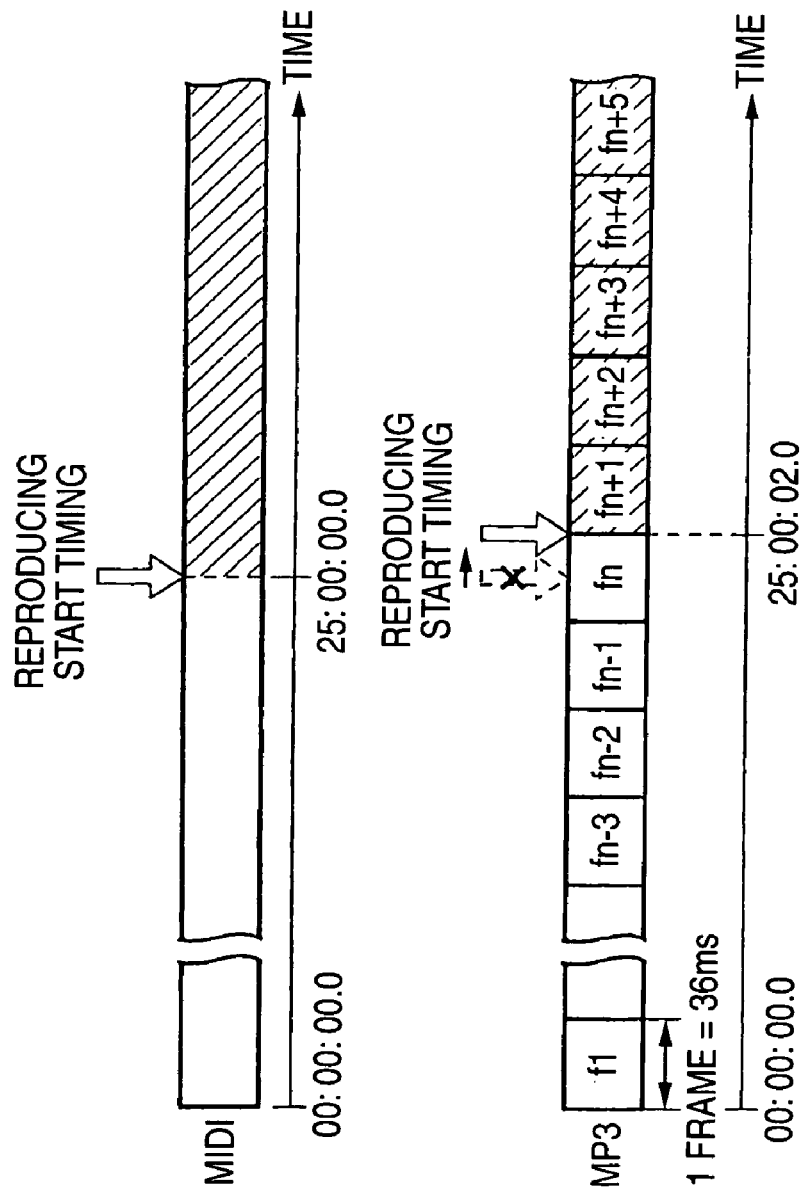

MUSIC REPRODUCING SYSTEM

BACKGROUND OF THE INVENTION

The present invention relates to the technology to reproduce the musical pieces recorded in different formats such as MIDI (Musical Instrument Digital Interface: registered trade mark) and MP3 (MPEG-1 Audio Layer-III), for example, from the middle of the musical piece in a synchronized state.

The MIDI standard is well known as the standard to provide the reproducing information, and the MP3 format is often used as one of data compression algorithms to record the music. The former is often utilized in the karaoke system (see Patent Literature 1, for example). In recent years, the proposal that intends to use together the musical piece data in the MIDI format (referred to as "MIDI data" hereinafter) and the music data in the MP3 format (referred to as "MP3 data" hereinafter) in the applications suitable to respective characteristics is announced. For example, because the MP3 data can realize the real quality of sound with reality rather than the MIDI data, such MP3 data are used to reproduce a chorus sound or a guide vocal (a vocal sound of the human voice) which requires such characteristic, or a performance of the musical instrument with a distinctive feature, or the like, whereas the MIDI data are used to reproduce an automatic accompaniment, a guide melody, or the like, and others. Here, the guide vocal and the guide melody are that they are reproduced with the accompaniment to permit the singer to sense the primary vocal and melody and sing the song readily.

Patent Literature 1; JP-A-10-11097

Meanwhile, sometimes the music piece reproducing system such as the karaoke system must reproduce the musical piece from the middle of the musical piece. For example, there is the case where the musical piece is reproduced again from the position in which the fast-forward reproducing or the rewind is ended. However, when the operator tries to reproduce the musical piece composed of both the MIDI data and the MP3 data described above from the middle of the musical piece, there existed the problem described in the following.

FIG. 9 is a view showing such a behavior that the MIDI part and the MP3 part are reproduced on a time-series basis. In the MIDI part, the position in which the reproducing is started in the middle of the musical piece can be decided in unit of 1 (ms). Therefore, if the start of the reproducing is instructed when just 25 minutes lapsed after the musical piece is started, for example, the MIDI part in the hatched area is reproduced from the timing indicated with an arrow in FIG. 9.

In contrast, the MP3 data has a data structure in which a plurality of frames in unit of 36 (ms), for example, are connected in series, and thus the musical piece can be reproduced merely in this frame unit. As a result, if the operator tries to start the reproducing at the timing when just 25 minutes lapsed after the musical piece is started, as described above, the musical piece cannot be reproduced from that timing unless such timing coincides accidentally with the head portion of the frame. In such case, the reproducing system cannot but reproduce the musical piece from the head portion of the frame (indicated with a solid-line arrow in FIG. 9) subsequent to the timing (indicated with a dashed-line arrow) at which the musical piece is essentially reproduced. In other words, since the reproducing of the MP3 part is started somewhat later than the reproducing of the MIDI part, it is possible that the listener hears such reproducing as the artificial performance.

SUMMARY OF THE INVENTION

The present invention has been made to overcome such problems, and it is an object of the present invention to permit a reproducing system to reproduce the musical piece data having different reproducing timings in the middle of the musical piece from the same timing.

In order to solve the aforesaid object, the invention is characterized by having the following arrangement.

(1) A music reproducing system comprising:

a storage that stores a first data sequence and a second data sequence that constitute musical piece data and have timings at which reproducing can be started from a middle of a data sequence;

a first reproducing unit that reads the first data sequence and reproduces a first musical piece based on the first data sequence;

a second reproducing unit that reads the second data sequence and reproduces a second musical piece based on the second data sequence;

a reproducing timing designating unit that designates a reproducing timing at which the musical piece data is started to be reproduced; and a first timing specifying unit that specifies a first timing which is positioned in time prior to the reproducing timing and from which the first musical piece can be reproduced by the first reproducing unit in case that, at the designated reproducing timing, the second musical piece can be started to be reproduced by the second reproducing unit and the first musical piece cannot be started to be reproduced by the first reproducing unit, wherein the second reproducing unit starts reproducing the second musical piece from the designated reproducing timing, and wherein the first reproducing unit starts reproducing the first musical piece from the specified first timing and mute-reproduces the first musical piece until a time progress comes up to the designated reproducing timing.

(2) The musical reproducing system according to (1) further comprising:

a second timing specifying unit that specifies a second timing which is positioned in time prior to the designated reproducing timing and from which the second musical piece can be reproduced by the second reproducing unit in the case that, at the designated reproducing timing, the second musical piece cannot be stated by the second reproducing unit, wherein the second reproducing unit stars reproducing the second musical piece from the specified second timing and mute-reproduces the second musical piece until a time progress comes up to the designated reproducing timing.

(3) The music reproducing system according to (1), wherein the first timing specifying unit specifies the first timing that is displaced in response to a period in which a quality of sound of the first musical piece is stabilized.

(4) The music reproducing system according to (1), wherein the first and second data sequences are data sequences having a frame structure, frame sizes of which are different therebetween.

(5) The music reproducing system according to (1), wherein the first and second data sequences are data sequences having a frame structure, boundary positions of which are different therebetween.

(6) A method of starting reproducing, from a reproducing timing arbitrary designated, musical piece data constituted by a first data sequence and a second data sequence, the method comprising the steps of:

starting reproducing a first musical piece based on the first data sequence in time prior to the designated reproducing timing such that the first musical piece is mute-reproduced until a time progress comes up to the designated reproducing timing; and starting reproducing a second musical piece based on the second data sequence.

(7) The method according to (6), wherein in the step of reproducing the second musical piece, the second musical piece is started to be reproduced in time prior to the designated reproducing timing such that the second musical piece is mute-reproduced until a time progress comes up to the designated reproducing timing.

(8) The method according to (6), wherein the first timing specifying unit specifies the first timing that is displaced in response to a period in which a quality of sound of the first musical piece is stabilized.

(9) A computer readable recording medium storing a program which causes a computer to start reproducing, from a reproducing timing arbitrary designated, musical piece data constituted by a first data sequence and a second data sequence, the program causing the computer to execute the steps of:

starting reproducing a first musical piece based on the first data sequence in time prior to the designated reproducing timing such that the first musical piece is mute-reproduced until a time progress comes up to the designated reproducing timing; and starting reproducing a second musical piece based on the second data sequence.

(10) The recording medium according to (9), wherein in the step of reproducing the second musical piece, the second musical piece is started to be reproduced in time prior to the designated reproducing timing such that the second musical piece is mute-reproduced until a time progress comes up to the designated reproducing timing.

(11) The method according to (9), wherein the first timing specifying unit specifies the first timing that is displaced in response to a period in which a quality of sound of the first musical piece is stabilized.

(12) A music reproducing system for starting reproducing, from a reproducing timing arbitrary designated, musical piece data constituted by a first data sequence and a second data sequence, the system comprising:

means for starting reproducing a first musical piece based on the first data sequence in time prior to the designated reproducing timing such that the first musical piece is mute-reproduced until a time progress comes up to the designated reproducing timing; and means for starting reproducing a second musical piece based on the second data sequence.

(13) The music reproducing system according to (12), wherein the second musical piece is started to be reproduced in time prior to the designated reproducing timing such that the second musical piece is mute-reproduced until a time progress comes up to the designated reproducing timing.

(14) The method according to (9), wherein the first timing specifying unit specifies the first timing that is displaced in response to a period in which a quality of sound of the first musical piece is stabilized.

According to the present invention, even the musical pieces having different formats can be reproduced from the middle of the musical piece to synchronize with each other.

BRIEF DESCRIPTION OF THE DRAWINGS

FIG. 8 is a view showing such a behavior that three data sequences D1, D2 and D3, which have a different data format respectively, are reproduced from the middle of the musical piece.

FIG. 9 is a view showing such a behavior that the MIDI part and the MP3 part are reproduced in the prior art on a time-series basis.

DETAILED DESCRIPTION OF PREFERRED EMBODIMENTS

An embodiment of the present invention will be explained with reference to the drawings hereinafter.

Configuration of the Embodiment

Figure 1:
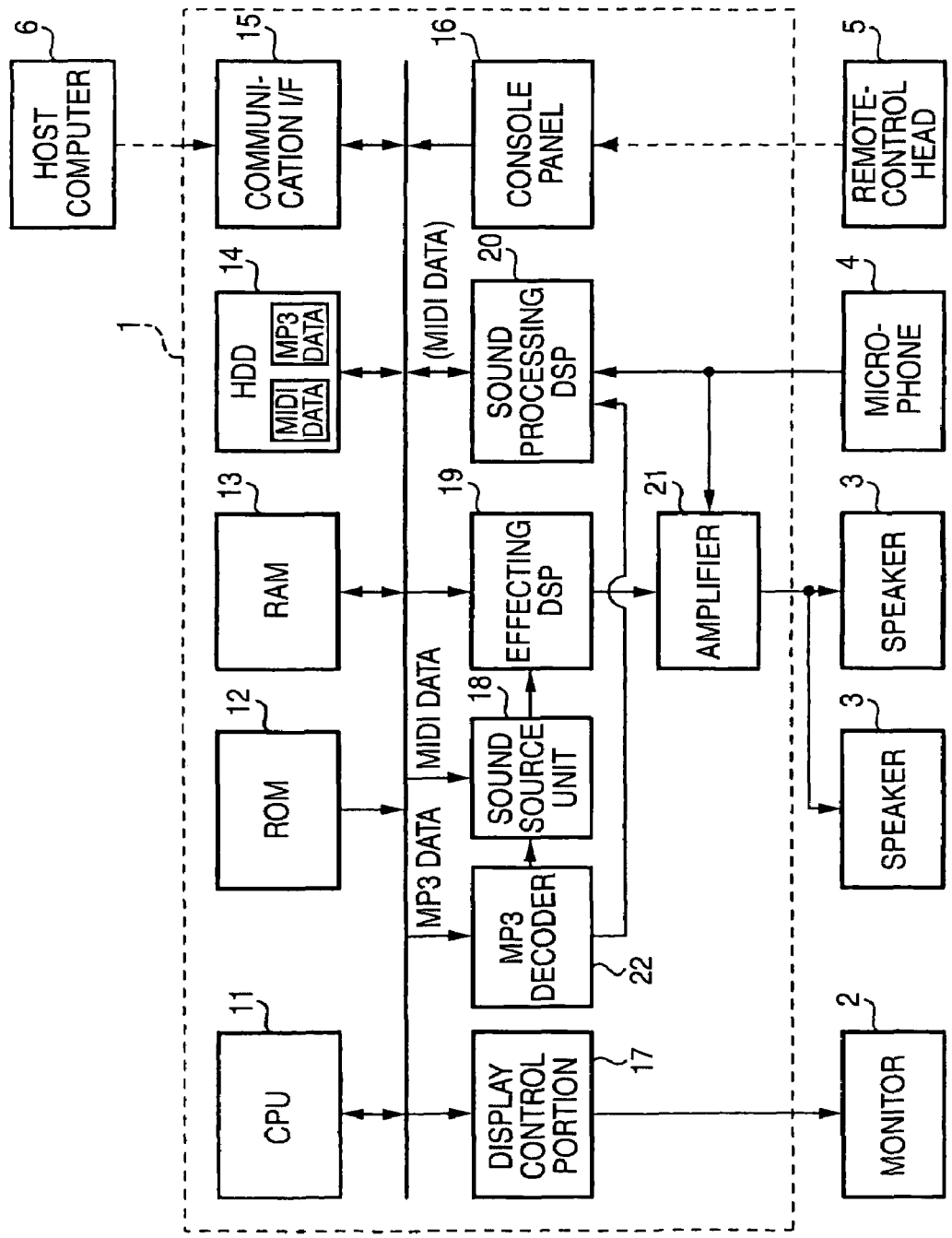
FIG. 1 is a diagram showing a configuration of a karaoke system to which a music reproducing system according to an embodiment of the present invention is applied.

FIG. 1 is a block diagram showing a configuration of a karaoke system main body 1 according to the embodiment of the present invention. Respective portions of the system will be explained hereunder.

A CPU 11 controls respective portions of the system by executing various programs stored in a ROM 12 while utilizing a RAM 13 as a work area. A communication I/F (interface) 15 receives the musical piece data from a host computer 6 serving as a sender of the musical piece data, and then transfers the musical piece data to a HDD (Hard Disk Drive) 14 under control of the CPU 11. Also, it is possible to execute the data transfer to the HDD 14 by using the DMA (Direct Memory Access).

As the musical piece data stored in the HDD 14, two types of data sequences, i.e., the performance data in the MIDI format (referred to as "MIDI data" hereinafter) and the music data in the MP3 format (referred to as "MP3 data" hereinafter) are contained. When the user executes the operation to designate the musical piece by using a console panel 16, the CPU 11 reads the musical piece data from the HDD 14 to reproduce the designated musical piece. The CPU 11 loads the MIDI data out of the read musical piece data into the RAM 13, and then outputs the MIDI data to a sound source unit 18 and a sound processing DSP 20 by reading sequentially the data from the RAM 13. Also, the CPU 11 outputs the MP3 data out of the read musical piece data to a MP3 decoder 22. The MP3 decoder 22 decodes the MP3 data sequentially, and then outputs the decoded MP3 data to the sound source unit 18 and the sound processing DSP 20. The sound source unit 18 generates musical sound signals based on the MIDI data output from the CPU 11 and the MP3 data output from the MP3 decoder 22, and then outputs the signals to an effecting DSP 19. The effecting DSP 19 gives effect sounds such as reverberation, echo, etc. to the musical sound signals generated by the sound source unit 18. Then, the musical sound signals to which the effect sounds are given are subjected to the D/A-conversion by the effecting DSP 19, and then output to an amplifier 21. The sound processing DSP 20 generates the chorus sound signals based on the MIDI data output from the CPU 11 and the MP3 data output from the MP3 decoder 22, and then outputs the chorus sound signals to the amplifier 21. The amplifier 21 amplifies the singing sound signals supplied from a microphone 4 in addition to the musical sound signals and the chorus sound signals, and then mixes these sound signals to emit the sound from speakers 3, 3.

The console panel 16 is an operation panel provided to a front surface of the karaoke system main body 1, and has a large number of keys such as a ten-key pad, a key control key, etc. thereon. Also, the console panel 16 has a receiver portion that receives the signal (infrared signal, radio signal, or the like) emitted from a remote-control head 5. The signal received by the receiver portion is transferred to the CPU 11. The karaoke system main body 1 has a function of fast-forwarding or rewinding the musical piece and a muting function of reproducing the musical piece not to emit the sound, for example, in addition to the function of reproducing the musical piece. The operator can instruct the system to reproduce, stop, fast forward, rewind, and mute the musical piece by operating the console panel 16 or the remote-control head 5.

A display control portion 17 executes the control to display video data, words, etc. on a monitor 2. The video data are stored in a video data storing portion (not shown) (the DVD player, or the like), and the video can be read in answer to a genre of the music. The words are displayed by using the words data in the musical piece data.

Figure 2:
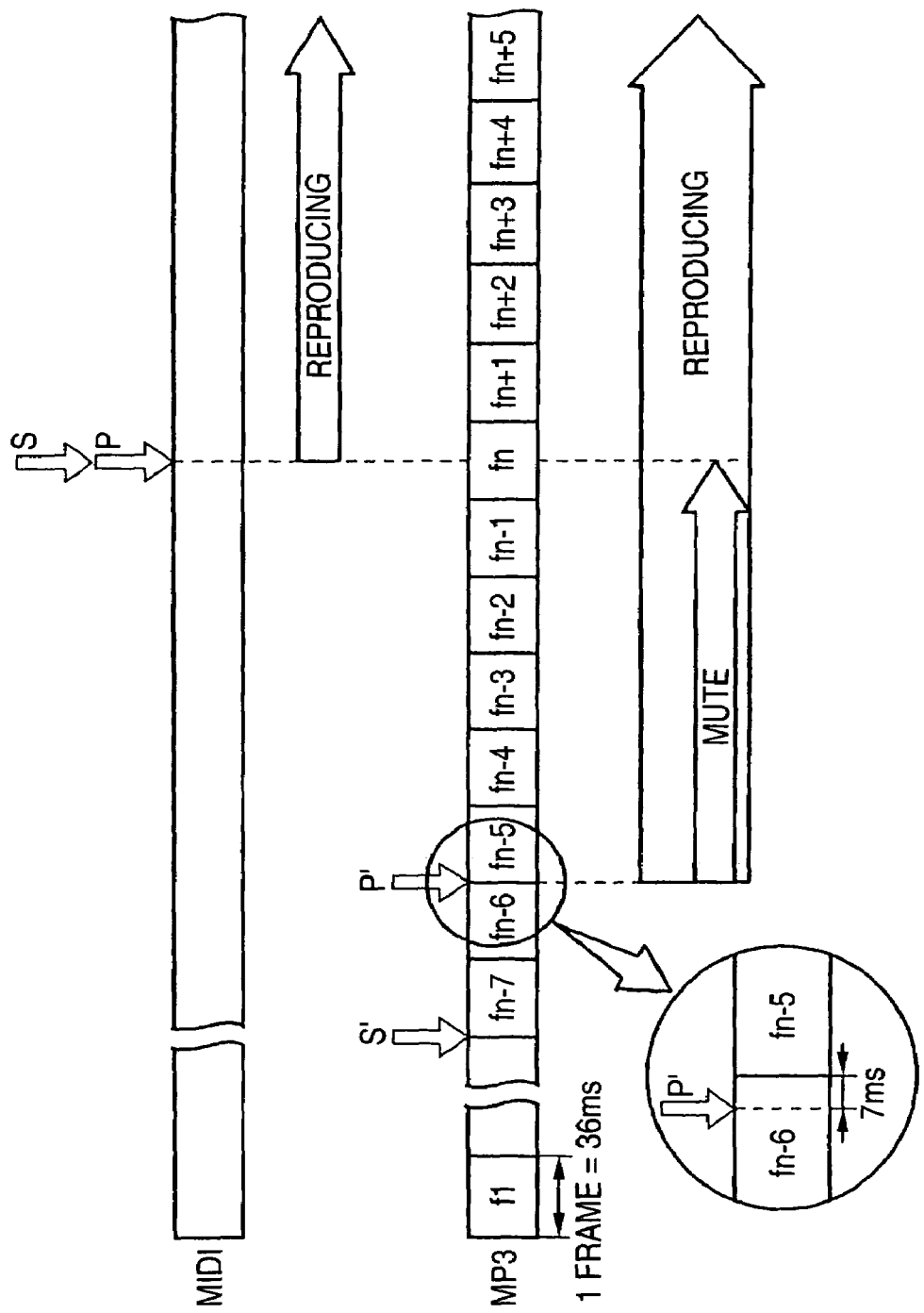
FIG. 2 is a view showing such a behavior that MIDI data and MP3 data are reproduced from the middle of the musical piece in the same embodiment on a time-series basis.

Now, FIG. 2 is a view showing such a behavior that the MIDI part and the MP3 part are reproduced in the karaoke system main body 1 on a time-series basis.

In the MIDI part, when the reproducing start position P is designated at any timing in unit of 1 (ms), the MIDI data are read from that a reproducing start position P and also the subsequent MIDI part is reproduced. In other words, the seek position S from which the MIDI data are read and the reproducing start position P from which the reproducing of the MIDI part is started are at the same position (timing). In contrast, in the MP3 data, since the reproducing start position P does not coincide with the boundary of the frame fn, as shown in FIG. 2, the MP3 part cannot be reproduced from the timing that corresponds to this reproducing start position P.

Therefore, in the MP3 part, the timing (reproducing start position P' in FIG. 2), which appears earlier than the designated reproducing start position P and from which the reproducing of the MP3 part can be started, is specified. Then, the MP3 part is reproduced from this reproducing start position P'.

Here, this reproducing start position P' is specified as follows. That is, the musical piece that is reproduced based on the MP3 data needs a predetermined period until the quality of sound is stabilized. The reason for this is that, for the purpose of heightening the compression effect, preceding and succeeding frames lend and borrow mutually the bits (the bit savings) in the MP3 standard, and thus a certain frame from which the reproducing is started is short of bits that are borrowed from the frame precedent to the certain frame, so that the sound cannot be reproduced precisely. Therefore, this reproducing start position P' is decided in light of a predetermined period required until the quality of sound is stabilized. For example, suppose that a frame length is 36 (ms) and the above predetermined period is about 200 (ms), the head portion of the frame that is positioned 5 or 6 frames obtained by executing the division 200 (ms)÷36 (ms) prior to the current frame is decided as the reproducing start position P'. In the case of the example shown in FIG. 2, the head portion of the frame fn-5 that is positioned 5 frames prior to the frame fn is decided as the reproducing start position P'.

Now, according to the experiment made by the inventors, it was found that two types of process delays explained hereunder are generated in the MP3 decoder 22.

First, in some case the MP3 decoder 22 that received the frame being read out from the HDD 14 decodes two frames received at first, but does not output such two frames to the sound source unit 18 to skip over them. Therefore, in view of such phenomenon, the position that goes back further from the above reproducing start position P' by 2 frames is decided as the seek position S' in the MP3 part. When doing this, the MP3 data that are necessary and sufficient to reproduce the music data from the timing in the reproducing start position P' can be supplied to the MP3 decoder 22. In the case of the example shown in FIG. 2, since the head portion of the frame fn-5 correspond to the reproducing start position P', the head portion of the frame fn-7 that appears 2 pieces prior to this frame fn-5 is decided as the seek position S'.

Then, it was also found that, when the MP3 decoder 22 starts a decoding process, a delay of the decoding process is generated in a minute period. This delay period is about 7 (ms), for example. For this reason, the MP3 decoder 22 starts the decoding process from the timing that is positioned 7 (ms) prior to the reproducing start position P'. An enlarged view in FIG. 2 shows the event that the decoding process is started from the timing that is positioned 7 (ms) in advance of the head portion of the frame fn-5.

In this manner, the MP3 part is started to reproduce from the timing corresponding to the reproducing start position P', nevertheless the reproducing process is executed at this time by using the muting function and thus the listener cannot hear the reproduced MP3 part as the sound. Such mute reproducing is continued until the progress of the MP3 part arrives at the timing corresponding to the reproducing start position P. Then, when the progress of the MP3 part comes up to the timing corresponding to the reproducing start position P, the sound is faded in to increased gradually the sound volume and also the muting function is canceled. At the same, the reproducing of the MIDI part is started. As a result, the MP3 part and the MIDI part can be reproduced from this point of time as the musical piece that can be actually heard, to synchronize with each other.

Operation of the Embodiment

Next, an operation of the karaoke system main body 1 constructed as above will be explained hereunder.

Figure 3:
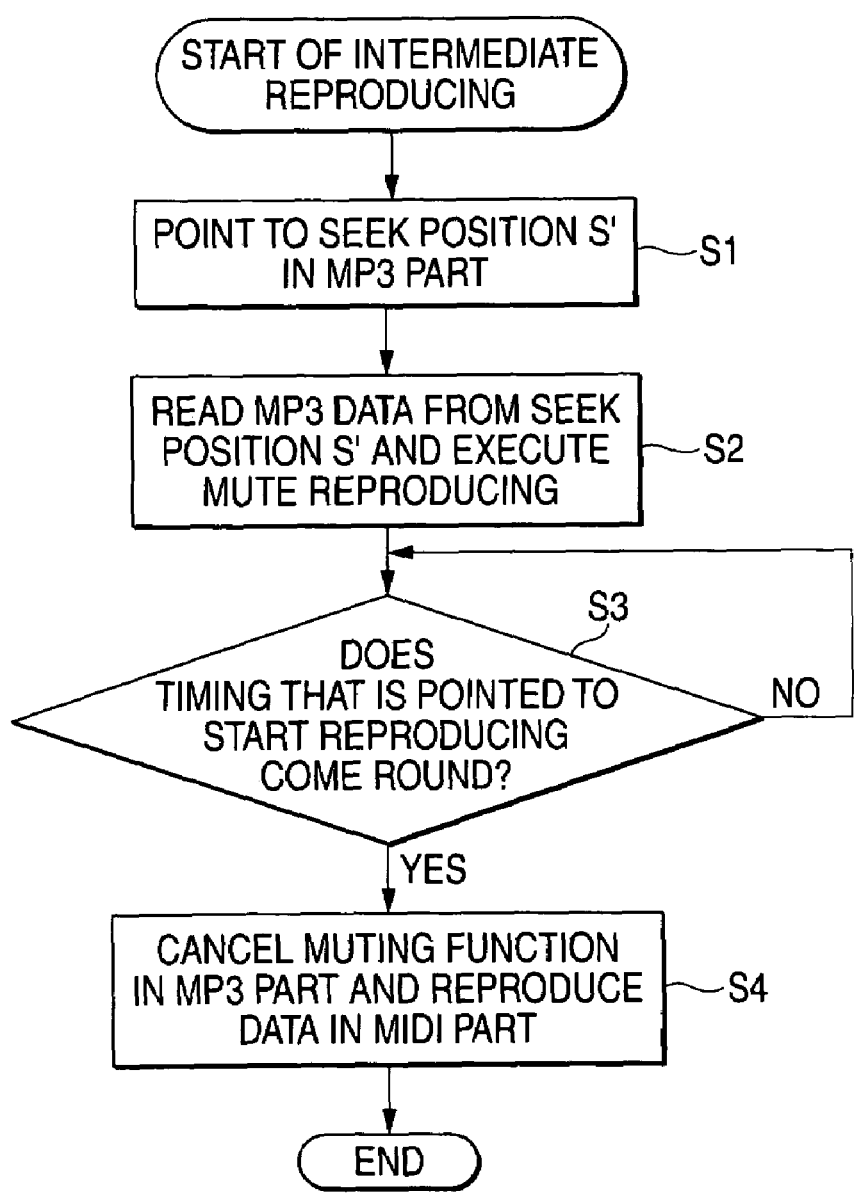
FIG. 3 is a flowchart showing an operation executed by CPU in the same embodiment.

When the user executes the musical piece designating operation by using the ten-key of the console panel 16 or the remote-control head 5, the musical piece data (the MIDI data and the MP3 data) used to reproduce the designated musical piece are read from the HDD 14 by the CPU 11, and then the musical piece reproducing process and the words display process are executed. Here, suppose that the user instructs the karaoke system main body 1 of the fast-forward reproducing by using the ten-key of the console panel 16 or the remote-control head 5 to execute the fast-forward reproducing for a certain period, and then executes the operation to start the reproducing from the middle of the musical piece. In response to this operation, the CPU 11 starts the process shown in FIG. 3.

First, as explained by using FIG. 2, the CPU 11 specifies the seek position S' in the MP3 part (step S1). That is, the CPU 11 goes back to the frame fn-7 that is positioned 7 frames prior to the frame fn, which corresponds to the reproducing start position P specified by the above reproducing starting operation, and then specifies the head portion of the frame fn-7 as the seek position S'.

Then, the CPU 11 reads the MP3 data in the HDD 14 from the frame at the seek position S', and then output this data to the MP3 to execute the mute reproducing (step S2). At this time, it is from the timing that is positioned 7 (ms) prior to the head portion of the frame fn-5 that actually the reproducing is started. Then, the CPU 11 still continues the above mute reproducing until the timing (the reproducing start position P) that is specified by the above reproducing starting operation comes round (step S3; No). Then, when the above timing comes round (step S3; Yes), the CPU 11 cancels the muting function in the MP3 part to execute the normal reproducing process and also reads the MIDI data from the MIDI part in the seek position S to start the reproducing (step S4).

Figure 4:
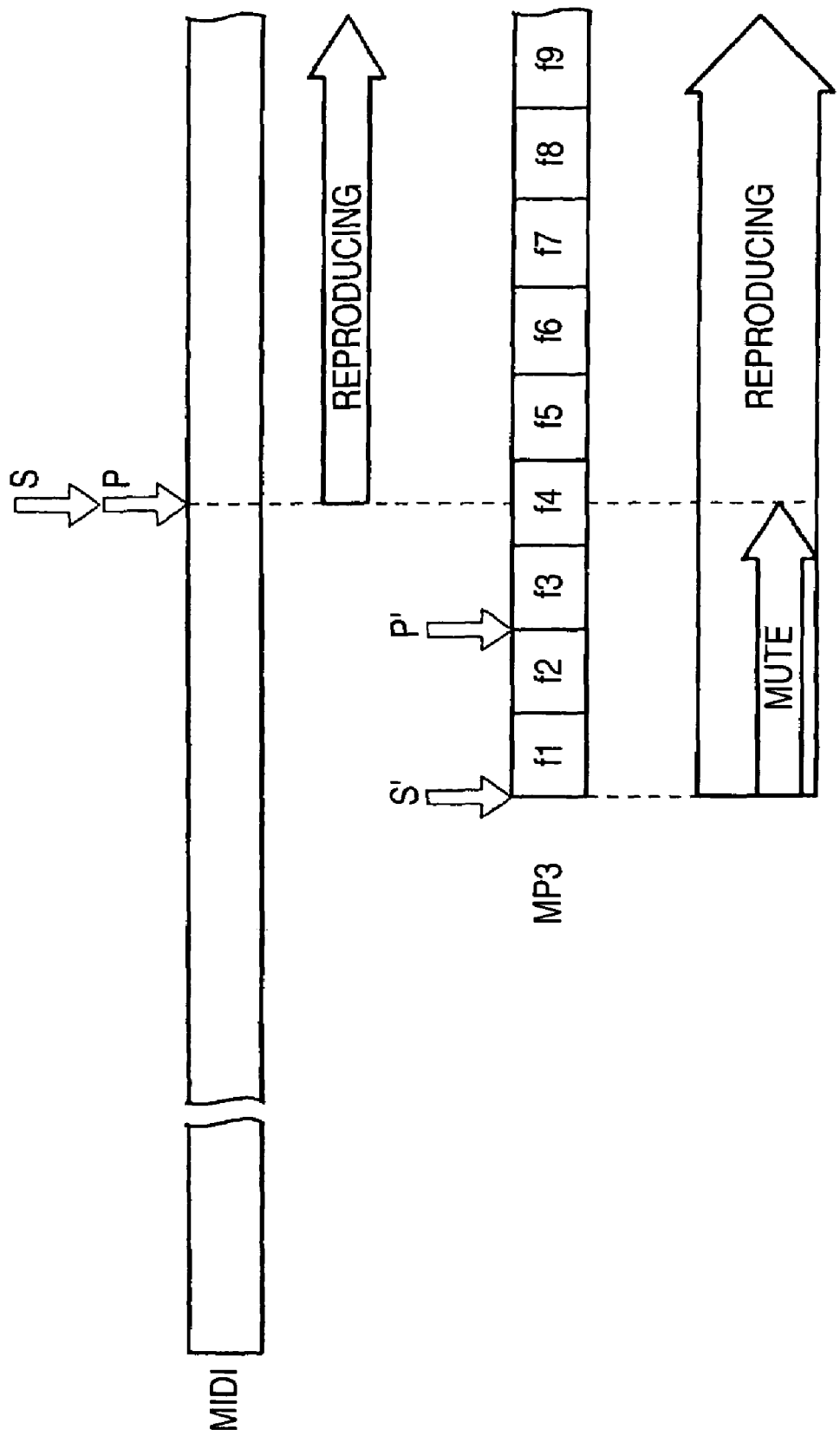
FIG. 4 is a view showing such a behavior that a MIDI part and an MP3 part are reproduced from the middle of the musical piece in the same embodiment on a time-series basis.

In this case, as shown in FIG. 4, like the case where the MP3 part is started from the middle of the MIDI part, sometimes the CPU 11 cannot go back from the reproducing start position P by 7 frames in the MP3 part. In such case, the CPU 11 may set the position to which the CPU 11 can go back by available frames (3 frames in FIG. 4) as the seek position S' and then may read the MP3 data from the position to start the mute reproducing.

As explained above, according to the present embodiment, in the MP3 part, the mute reproducing is started from the timing that appeared earlier than the reproducing start timing designated by the operator, and then the mute in the MP3 part is canceled and also the reproducing of the MIDI part is started when the designated reproducing start timing arrives at. As a result, the listener can hear as if both the MIDI part and the MP3 part are started at the same timing. Also, the reproducing start position P' is decided in light of a period within which the quality of sound of the music is stabilized and various delay times in the MP3 decoder 22. Therefore, the listener can also hear the music piece from a point of reproducing start time in a state that the quality of sound is stabilized.

<Variation>

The embodiment explained as above is merely given as an example, and there are a variety of variations.

In the MP3 part, the explained contents about the predetermined period required until the quality of sound is stabilized and the process delay of the MP3 decoder 22 are the values peculiar to the present embodiment. Therefore, implementation of the musical piece reproducing system according to the present invention is not always limited to these values. For example, the position that is positioned 5 frames prior to the current frame is set as the reproducing start position and the position that is positioned 7 frames prior to the current frame is set as the seek position in the MP3 part. In this case, the position that is positioned the different number of frames prior to the current frame may be decided as the seek position and the reproducing start position respectively. Also, there is no necessity, as the case may be, that these circumstances should be considered. However, since the bit savings is executed to lend and borrow the bit between the frames in the MP3 part, the musical piece cannot be reproduced unless the data are read from the frame that is positioned at least one frame prior to the frame from which the reproducing is started. Also, if the process delay in the MP3 decoder 22 is negligibly small, there is no need to consider such delay.

Figure 5:
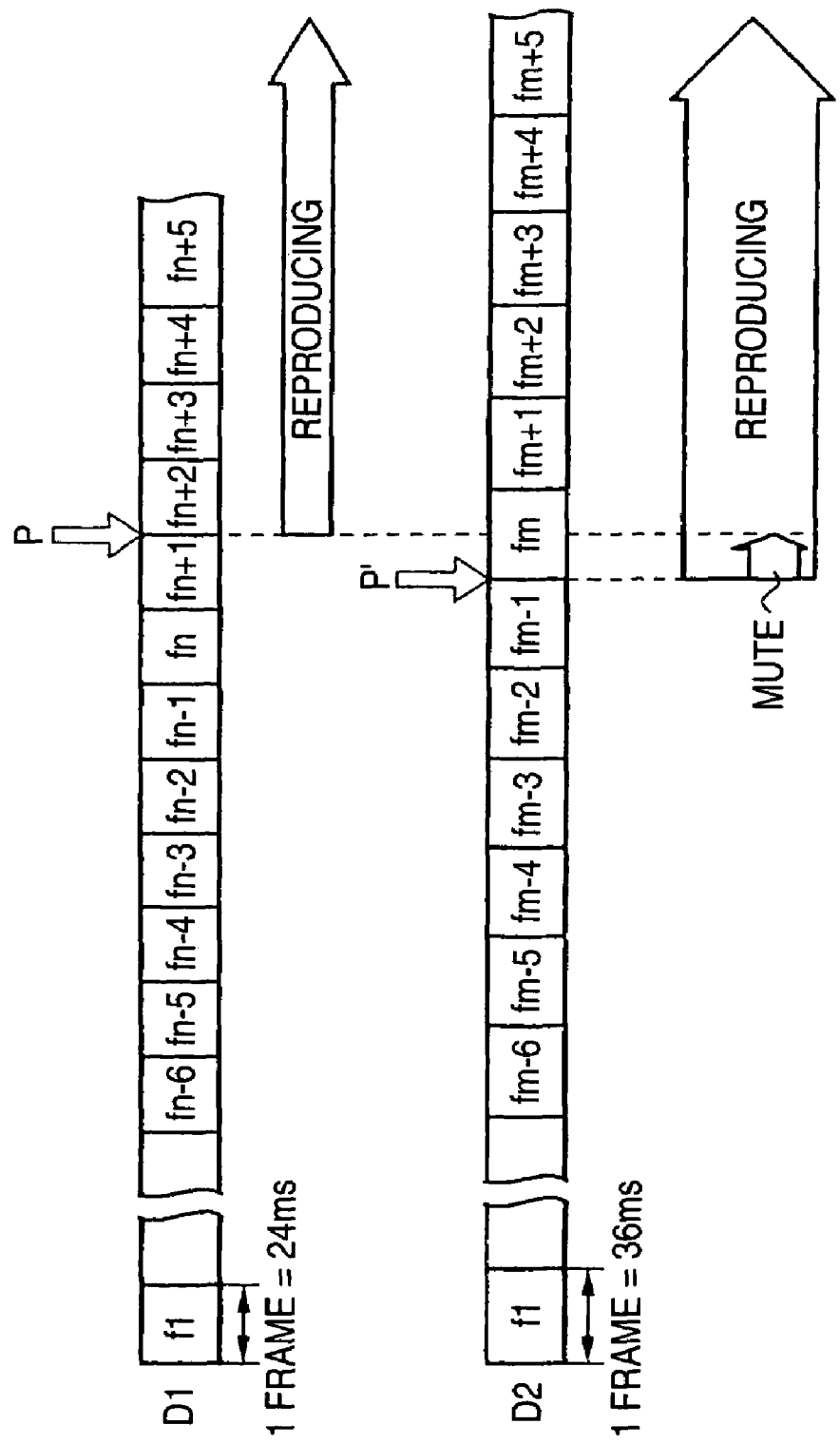
FIG. 5 is a view showing such a behavior that a data sequence D1 and a data sequence D2, both having a different frame size, are reproduced from the middle of the musical piece in the same embodiment on a time-series basis.

The data sequence formats constituting the musical piece data are not limited to the MIDI format and the MP3 format shown in the present embodiment. In short, any combination of plural data sequences may be employed if these data sequences have different timings at which the data can be read from the storing means from the middle of the data sequence to reproduce respectively. For example, as shown in FIG. 5, the present invention may be applied to the case where the data sequences have a different frame size respectively such that a data sequence D1 has a frame size of 24 (ms) and a data sequence D2 has a frame size of 36 (ms) In this case, the CPU 11 may start the mute reproducing in advance in the other data sequence on the basis of the reproducing start position P in one data sequence, and then may cancel the mute at a point of time when the above reproducing start position P lapsed. Here, the case is illustrated in FIG. 5 where the period required until the quality of sound is stabilized and the process delay in the MP3 decoder 22 are not taken into consideration (This is true of the cases in FIG. 6 to FIG. 8).

Figure 6:
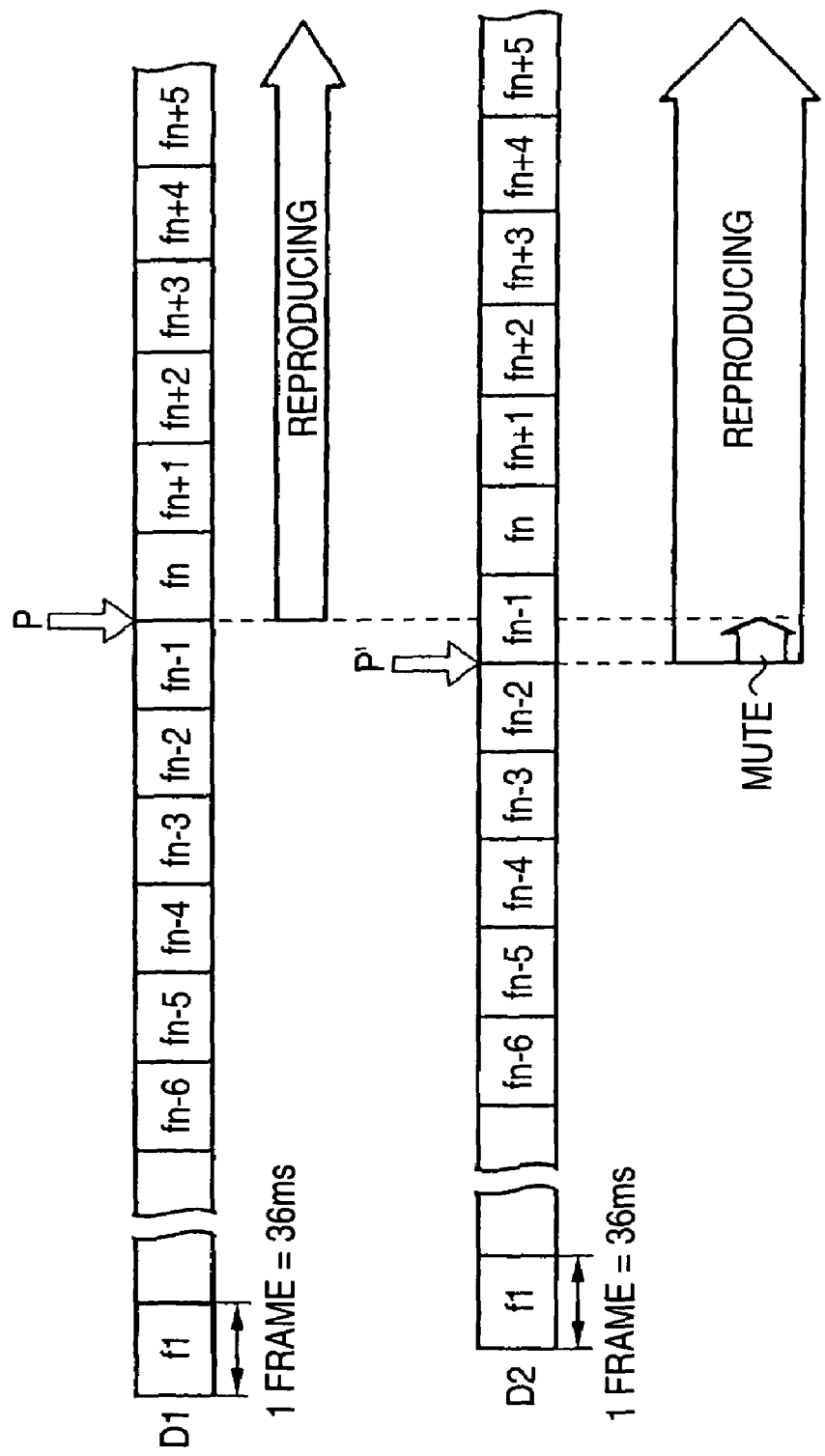
FIG. 6 is a view showing such a behavior that a data sequence D1 and a data sequence D2, both having the same frame size but a displaced frame boundary respectively, are reproduced from the middle of the musical piece in the same embodiment on a time-series basis.

Also, like the above, as shown in FIG. 6, for example, the present invention may be applied to the case where both frame sizes of the data sequences are the same as 36 (ms) respectively but the boundaries between the frames are displaced back and forth in time. In this case, the CPU 11 may also start in advance the mute reproducing in the other data sequence on the basis of the reproducing start position P in one data sequence, and then may also cancel the mute at a point of time when the above reproducing start position P lapsed.

Figure 7:
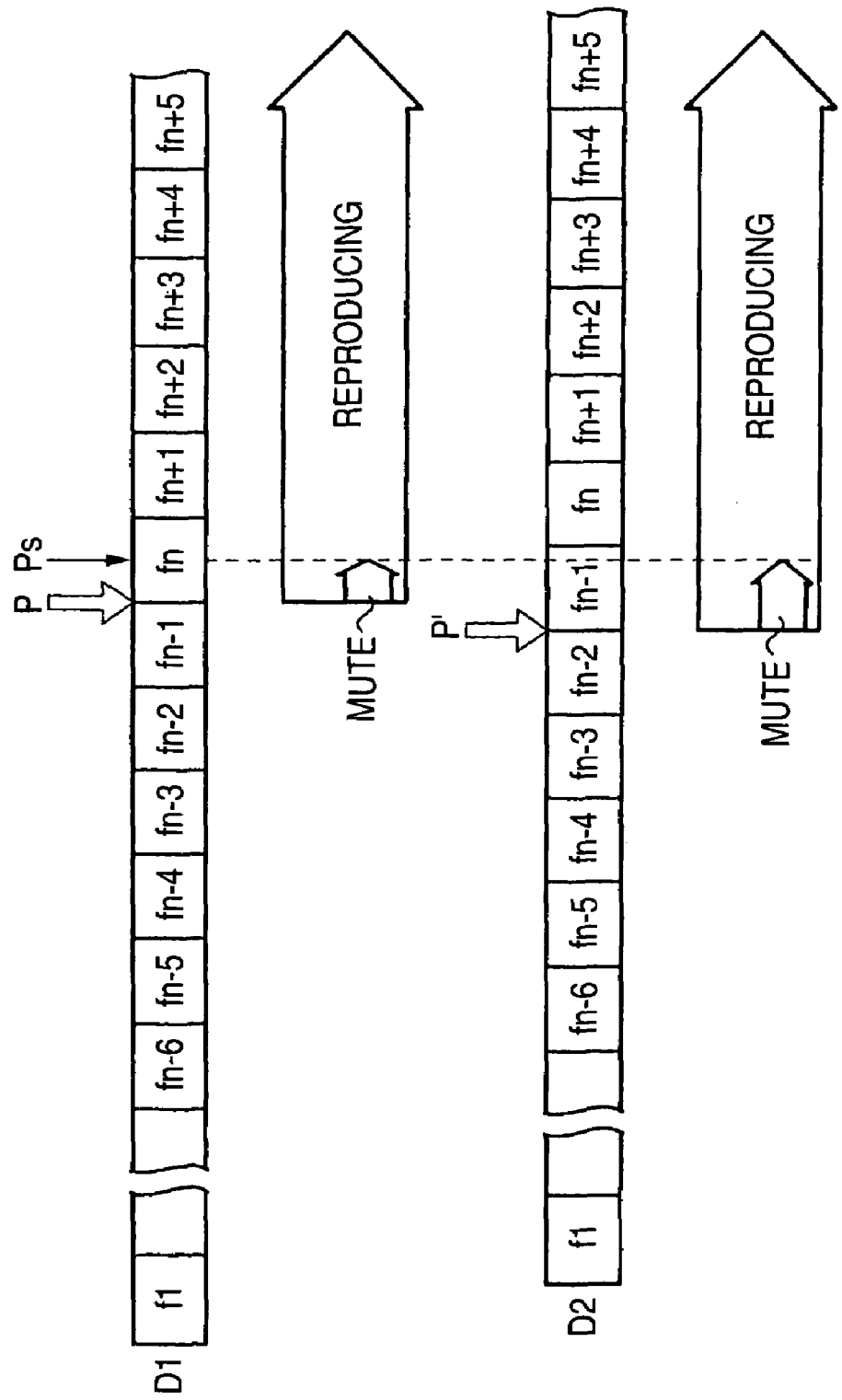
FIG. 7 is a view showing such a behavior that the data sequence D1 and the data sequence D2 are reproduced when the start of the reproducing of the musical piece is instructed in the middle of the frame.

In addition, as shown in FIG. 7, when both data sequences are constructed have the frame structure, such a case may be supposed that the instruction to start the reproducing is given at the timing at which the musical piece cannot be reproduced in either data sequence (the timing indicated with an arrow Ps). In such case, the CPU 11 may start precedingly the mute reproducing at the timing at which the reproducing can be started in respective data sequences in such a manner that the mute reproducing is started at the reproducing start position P in the data sequence D1 whereas the mute reproducing is started at the reproducing start position P' in the data sequence D2. Then, when the progress of the reproducing arrives at the timing indicated with the arrow Ps, the mute is canceled in both data sequences and subsequently the normal reproducing is carried out.

Further, the number of combined data sequences may be set to three or more. For example, the case where the number of data sequences is three is shown in FIG. 8. In this case, the CPU 11 may also start the mute reproducing in advance in remaining musical piece data on the basis of the reproducing start position P in one musical piece data, and then cancel all mutes at a point of time when the reproducing start position P lapsed. Also, in the present embodiment, explanation is made of the hardware structure in which the MP3 decoder 22 is prepared separately from the CPU 11. But the present invention is not limited to this structure, and the function of decoding the MP3 data may be implemented by executing the program stored in the ROM 12 or the HDD 14 by means of the CPU 11.

In this case, it is of course that the musical piece reproducing system according to the present invention can be applied to various systems other than the karaoke system shown in the present embodiment.

In the above-described embodiment, MP3 is employed as one of audio data compression standard. However, the present invention is not limited to MP3, and the other audio compression standard, for example, AAC can also be used.

What is claimed is:

1. A music reproducing system comprising:
    a storage that stores a first data sequence and a second data sequence that constitute musical piece data and have timings at which reproducing can be started from a middle of a data sequence;
    a first reproducing unit that reads the first data sequence and reproduces a first musical piece based on the first data sequence;
    a second reproducing unit that reads the second data sequence and reproduces a second musical piece based on the second data sequence;
    a reproducing timing designating unit that designates a reproducing timing at which the musical piece data is started to be reproduced; and
    a first timing specifying unit that specifies a first timing which is positioned in time prior to the reproducing timing and from which the first musical piece can be reproduced by the first reproducing unit in case that, at the designated reproducing timing, the second musical piece can be started to be reproduced by the second reproducing unit and the first musical piece cannot be started to be reproduced by the first reproducing unit, wherein the second reproducing unit starts reproducing the second musical piece from the designated reproducing timing, and wherein the first reproducing unit starts reproducing the first musical piece from the specified first timing and mute-reproduces the first musical piece until a time progress comes up to the designated reproducing timing.

2. The musical reproducing system according to claim 1 further comprising:
    a second timing specifying unit that specifies a second timing which is positioned in time prior to the designated reproducing timing and from which the second musical piece can be reproduced by the second reproducing unit in the case that, at the designated reproducing timing, the second musical piece cannot be stated by the second reproducing unit, wherein the second reproducing unit stars reproducing the second musical piece from the specified second timing and mute-reproduces the second musical piece until a time progress comes up to the designated reproducing timing.

3. The music reproducing system according to claim 1, wherein the first timing specifying unit specifies the first timing that is displaced in response to a period in which a quality of sound of the first musical piece is stabilized.

4. The music reproducing system according to claim 1, wherein the first and second data sequences are data sequences having a frame structure, frame sizes of which are different therebetween.

5. The music reproducing system according to claim 1, wherein the first and second data sequences are data sequences having a frame structure, boundary positions of which are different therebetween.

6. A method of starting reproducing, from a reproducing timing arbitrarily designated, musical piece data constituted by a first data sequence and a second data sequence, the method comprising:
    starting mute-reproducing a first musical piece based on the first data sequence at a time prior to the designated reproducing timing such that the first musical piece is mute-reproduced until a time progress comes up to the designated reproducing timing; and
    starting reproducing a second musical piece based on the second data sequence, wherein the first and second data sequences are data sequences having a frame structure, frame sizes of which are different therebetween.

7. The method according to claim 6, wherein in reproducing the second musical piece, the second musical piece is started to be reproduced at a time prior to the designated reproducing timing such that the second musical piece is mute-reproduced until a time progress comes up to the designated reproducing timing.

8. The method according to claim 6, wherein a first timing specifying unit specifies the first timing that is displaced in response to a period in which a quality of sound of the first musical piece is stabilized.

9. A computer readable recording medium storing a program which causes a computer to start reproducing, from a reproducing timing arbitrarily designated, musical piece data constituted by a first data sequence and a second data sequence, the program causing the computer to:
    start mute-producing a first musical piece based on the first data sequence at a time prior to the designated reproducing timing such that the first musical piece is mute-reproduced until a time progress comes up to the designated reproducing timing; and
    start producing a second musical piece based on the second data sequence, wherein the first and second data sequences are data sequences having a frame structure, frame sizes of which are different therebetween.

10. The recording medium according to claim 9, wherein in reproducing the second musical piece, the second musical piece is started to be reproduced at a time prior to the designated reproducing timing such that the second musical piece is mute-reproduced until a time progress comes up to the designated reproducing timing.

11. The method according to claim 9, wherein a first timing specifying unit specifies the first timing that is displaced in response to a period in which a quality of sound of the first musical piece is stabilized.

12. A music reproducing system for starting reproducing, from a reproducing timing arbitrarily designated, musical piece data constituted by a first data sequence and a second data sequence, the system comprising:
    means for starting mute-reproducing a first musical piece based on the first data sequence at a time prior to the designated reproducing timing such that the first musical piece is mute-reproduced until a time progress comes up to the designated reproducing timing; and
    means for starting reproducing a second musical piece based on the second data sequence, wherein the first and second data sequences are data sequences having a frame structure frame sizes of which are different therebetween.

13. The music reproducing system according to claim 12, wherein the second musical piece is started to be reproduced at a time prior to the designated reproducing timing such that the second musical piece is mute-reproduced until a time progress comes up to the designated reproducing timing.

14. The method according to claim 12, wherein a first timing specifying unit specifies the first timing that is displaced in response to a period in which a quality of sound of the first musical piece is stabilized.

* * * * *